United States Patent
Heller

(10) Patent No.: US 6,717,079 B2
(45) Date of Patent: Apr. 6, 2004

(54) ELECTRICAL SWITCHES AND METHODS OF ESTABLISHING AN ELECTRICAL CONNECTION

(75) Inventor: Edward D. Heller, Bedford, MA (US)

(73) Assignee: Varian Semiconductr EquipmentAssociates, Inc., Gloucester, MA (US)

( * ) Notice: Subject to any disclaimer, the term of this patent is extended or adjusted under 35 U.S.C. 154(b) by 0 days.

(21) Appl. No.: 10/176,817

(22) Filed: Jun. 21, 2002

(65) Prior Publication Data

US 2003/0234165 A1 Dec. 25, 2003

(51) Int. Cl.[7] .............................................. H01H 35/38
(52) U.S. Cl. .................................. 200/82 R; 200/81 R
(58) Field of Search ............................ 200/82 R, 81.6, 200/81.9 M, 82 B, 82 E, 182, 210, 81 R–81 H

(56) References Cited

U.S. PATENT DOCUMENTS

| | | | | |
|---|---|---|---|---|
| 3,487,185 A | * | 12/1969 | Schweizer | 200/82 R |
| 3,787,650 A | * | 1/1974 | Lewis | 200/61.04 |
| 3,793,498 A | * | 2/1974 | Matsui et al. | 200/61.45 R |
| 4,667,940 A | * | 5/1987 | Jaillet | 267/64.11 |
| 5,155,310 A | * | 10/1992 | Goans | 200/82 R |
| 5,187,337 A | * | 2/1993 | Fujie et al. | 200/82 R |
| 5,317,954 A | * | 6/1994 | Goans | 92/6 R |

* cited by examiner

Primary Examiner—Michael Friedhofer
Assistant Examiner—Lisa Klaus

(57) ABSTRACT

An electrical switch includes a tubular housing constructed substantially of a non-conductive material, a first electrical contact positioned at one end of the housing, a second electrical contact positioned at a second end of the housing, and a shuttle selectively displaceable within the housing between the first electrical contact and the second electrical contact. The shuttle is electrically connected to the first electrical contact. A spring mechanism positioned within the housing and connected to the shuttle biases the shuttle into a first position proximate the first electrical contact. The shuttle is displaceable into engagement with the second electrical contact by pressurized gas to establish an electrical connection between the first electrical contact and the second electrical contact. The disclosed switch may be employed to selectively ground the components of an ion implantation system and is particularly suitable for use in high-voltage environments.

18 Claims, 3 Drawing Sheets

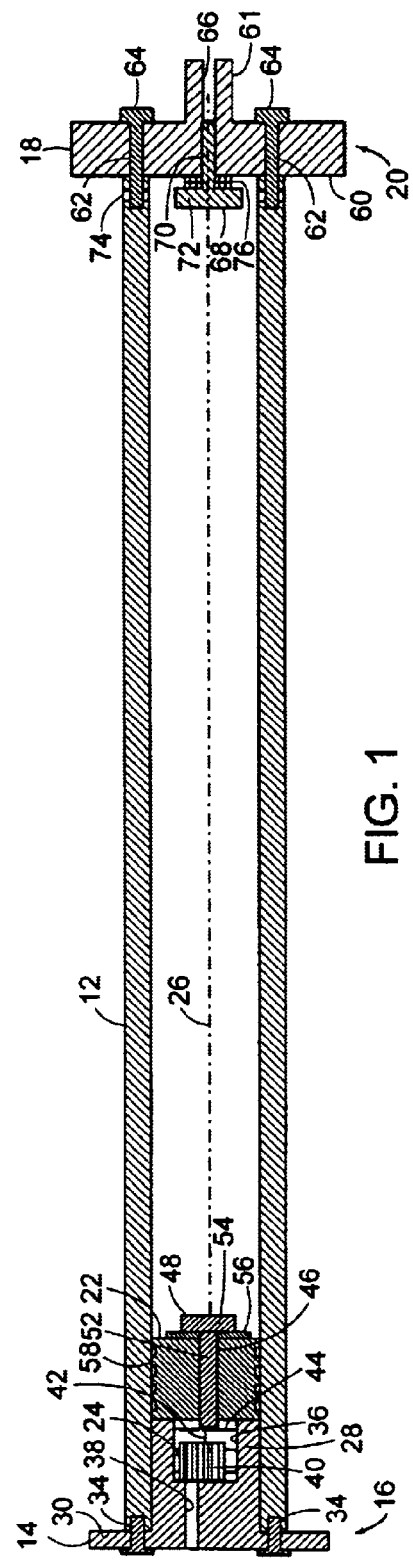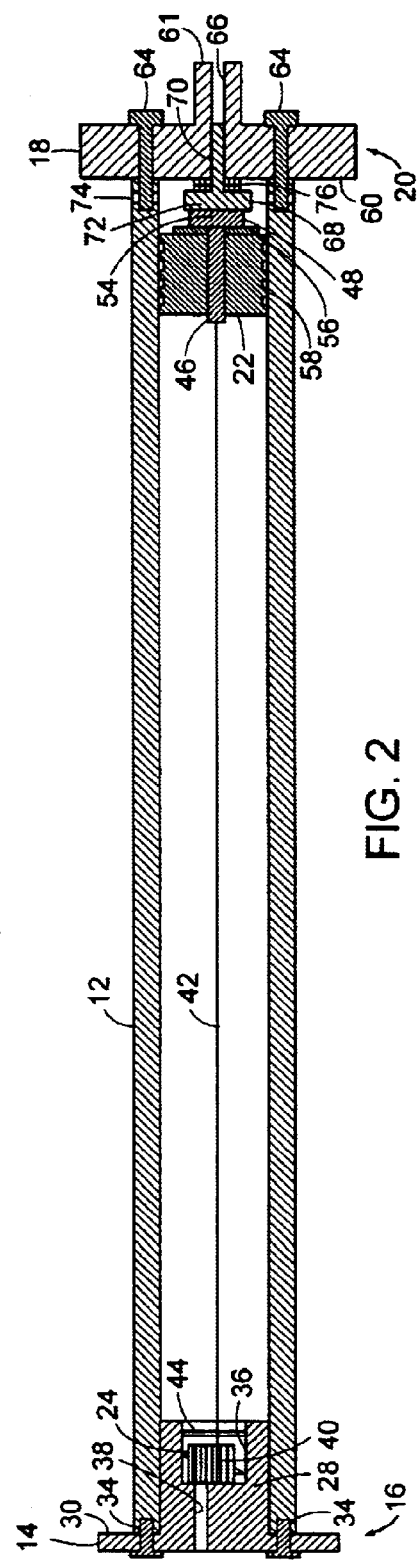

ELECTRICAL SWITCHES AND METHODS OF ESTABLISHING AN ELECTRICAL CONNECTION

BACKGROUND

Ion implantation generally involves accelerating of a beam of ions to a predetermined high energy to extract the desired ions for implantation from the ion beam. A high voltage, referred to as the acceleration voltage, is applied to the ion beam during acceleration to supply the energy necessary to effect beam extraction. In certain instances, the acceleration voltage may be between 5 keV to 25 keV. As a result, during ion beam acceleration certain components of the ion implantation system, including, for example, the gas box, may be at a high voltage, while other components may be at a low voltage or ground. In other modes of operation, such as the deceleration mode, it may be necessary to ground the gas box or other components of system. Selectively providing an electrical connection to a ground can be challenging, as the gas box and other components may be physically separated from a ground and conductive material, e.g. a metal wire or switch, between the gas box and the ground may cause arcing when the system is operated in the high-voltage acceleration mode.

SUMMARY

Disclosed herein are electrical switches and methods of selectively making an electrical connection that are particularly suited for use in high-voltage environments, such as within an ion implantation system. The switches and methods of selectively switching disclosed herein permit an electrical connection to be selectively established, while concomitantly minimizing the amount of electrically conductive materials employed, thereby inhibiting arcing during high voltage operations.

In one exemplary embodiment, an electrical switch may comprise a tubular housing having a non-conductive section constructed substantially of a non-conductive material, a first electrical contact positioned proximate one end of the housing, a second electrical contact spaced apart from the first electrical contact, and a shuttle selectively displaceable within the housing between the first electrical contact and the second electrical contact. The shuttle may be biased into a first position proximate the first electrical contact in a first mode of operation and, in a second mode of operation, may be displaceable toward the second electrical contact to establish an electrical connection between the first electrical contact and the second electrical contact.

In another exemplary embodiment, an electrical switch may comprise a tubular housing constructed substantially of a non-conductive material, a first electrical contact positioned at one end of the housing, a second electrical contact positioned at a second end of the housing, a shuttle selectively displaceable within the housing between the first electrical contact and the second electrical contact, and a spring mechanism positioned within the housing and connected to the shuttle to bias the shuttle into a first position proximate the first electrical contact. The shuttle may be electrically connected to the first electrical contact and may be displaceable into engagement with the second electrical contact by pressurized gas to establish an electrical connection between the first electrical contact and the second electrical contact.

In another exemplary embodiment, an electrical switch for selectively grounding the gas box of an ion implantation system may comprise a tubular housing constructed substantially of a non-conductive material, a first electrical contact positioned at the first end of the tubular housing, a second electrical contact positioned at the second end of the tubular housing, a shuttle selectively displaceable within the tubular housing between the first electrical contact and the second electrical contact, and a spring mechanism positioned within the tubular housing and connected to the shuttle to bias the shuttle into a first position proximate the first electrical contact and within the gas box. The first end of the tubular housing may be positioned within the gas box and the second end of the tubular housing may be spaced apart from the first end across an air gap between the gas box and a ground. The first electrical contact may be electrically connected to the gas box and the second electrical contact may be electrically connected to a ground. The shuttle may be electrically connected to the first electrical contact and may be displaceable into engagement with the second electrical contact by pressurized gas to establish an electrical connection between the first electrical contact and the second electrical contact.

In a further exemplary embodiment, a method of selectively grounding a gas box of an ion implantation system may comprise providing an electrical switch comprising a tubular housing constructed substantially of a non-conductive material, a first electrical contact positioned at the first end of the tubular housing and electrically coupled to the gas box, a second electrical contact positioned at the second end of the tubular housing and electrically connected to a ground, and a shuttle selectively displaceable within the tubular housing between the first electrical contact and the second electrical contact. The shuttle may be electrically connected to the first electrical contact. The tubular housing may have a first end positioned within the gas box and a second end spaced apart from the first end across an air gap between the gas box and a ground. The method may further include positioning the shuttle proximate the first end of the tubular housing in a first mode of operation of the ion implantation system and advancing the shuttle into contact with the second electrical contact in a second mode of operation of the ion implantation system to establish an electrical connection between the first and second electrical contact.

BRIEF DESCRIPTION OF THE DRAWINGS

These and other features and advantages of the electrical switches and methods disclosed herein will be more fully understood by reference to the following detailed description in conjunction with the attached drawings in which like reference numerals refer to like elements through the different views. The drawings illustrate principles of the systems and methods disclosed herein and, although not to scale, show relative dimensions.

FIG. 1 is a side elevational view in cross-section of an exemplary embodiment of an electrical switch, illustrating the shuttle of the switch in a first position;

FIG. 2 is a side elevational view in cross-section of the switch of FIG. 1, illustrating the shuttle of the switch in a second position;

DETAILED DESCRIPTION OF EXEMPLARY EMBODIMENTS

Figure 3:
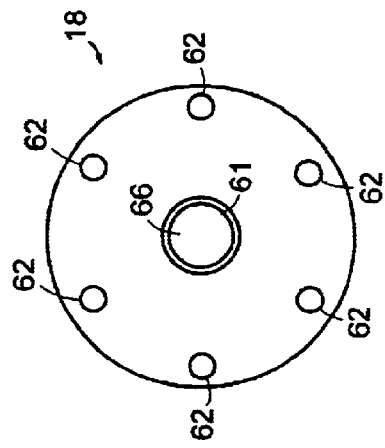
FIG. 3 is an end view of the first end of the switch of FIG. 1.

To provide an overall understanding, certain illustrative embodiments will now be described; however, it will be understood by one of ordinary skill in the art that the devices and methods described herein can be adapted and modified to provide devices and methods for other suitable applications and that other additions and modifications can be made without departing from the scope of the systems and methods described herein.

Unless otherwise specified, the illustrated embodiments can be understood as providing exemplary features of varying detail of certain embodiments, and therefore, unless otherwise specified, features, components, modules, and/or aspects of the illustrations can be otherwise combined, separated, interchanged, and/or rearranged without departing from the disclosed devices or methods. Additionally, the shapes and sizes of components are also exemplary and unless otherwise specified, can be altered without affecting the disclosed systems or methods.

Referring now to FIGS. 1 and 2, there is shown an exemplary embodiment of an electrical switch 10. In the exemplary embodiment, the switch 10 includes a generally tubular shaped housing 12 that may be constructed substantially of a non-conductive material, a first end cap 14 positioned at a first end 16 of the housing 10, and a second end cap 18 positioned at a second end 20 of the housing 10. The first end cap 14 and the second end cap 18 provide electrical contacts for the switch 10 that permit the switch 10 to be electrically connected to other components. A piston-like shuttle 22 is disposed within the housing 12. The shuttle 22 may be selectively displaced within the housing 10 between the first end cap 14 and the second end cap 18. A spring mechanism 24 may be positioned within the housing 22 and may be connected to the shuttle 22 to bias the shuttle into a first position proximate the first end cap 14, as illustrated in FIG. 1. In the exemplary embodiment illustrated in FIG. 1, the shuttle 22 is electrically connected to the first end cap 14. In operation, the shuttle 22 may be selectively displaced into engagement with the second end cap 18 by pressurized gas or by another displacement mechanism to establish an electrical connection between the first end cap 14 and the second end cap 18, as illustrated in FIG. 2. Upon removal of the pressurized gas, the shuttle 22 may be returned to the first position by the spring mechanism 24.

Figure 4:
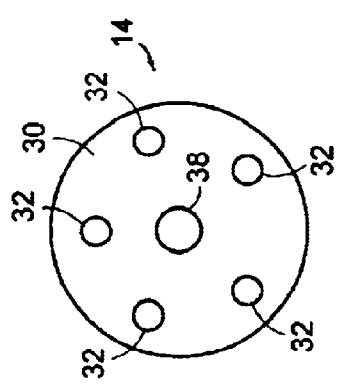
FIG. 4 is an end view of the second end of the switch of FIG. 1.

The tubular housing 12 is generally formed along a longitudinal axis 26 and can have a variety of cross-sectional shapes, including circular, oval, rectangular, square, polygonal, and the like. The housing 12 of the exemplary embodiment has a circular cross-section, as best illustrated by FIGS. 3 and 4. As discussed above, the housing 12, or selected sections of the housing 12, may be constructed substantially from a non-conductive material. For example, the entire length of the housing 12 may be constructed substantially from a non-conductive material or one or more discrete lengths of the housing 12 may be constructed substantially from a non-conductive material. Generally, the non-conductive section of the housing 12 may be positioned in a high-voltage gap between two or more components that are to be electrically connected by the switch 10 to inhibit arcing between the components during high-voltage operations. Thus, the length and number of the non-conductive sections (e.g., one or more lengths) may be selected based on the size and configuration of the high-voltage gap between the components to be connected by the switch 10. In one exemplary embodiment, the housing 12 is constructed from polyvinyl chloride (PVC). The housing 12 may be constructed completely from a non-conductive material or, alternatively, may be constructed from sufficient non-conductive material to render the housing 12 non-conductive. For example, in extreme high-voltage conditions, e.g., greater than 20 keV, it may be desirable to construct the housing 12 completely from a non-conductive material. Suitable non-conductive materials may include non-conductive polymers such as thermosett and thermoplastic polymers.

Continuing to refer to FIGS. 1 and 3, the first end cap 14 in the exemplary embodiment has a generally cylindrical body 28 that is sized and shaped to fit within the first end 16 of the tubular housing 12. A flange 30 is attached to one end of the cylindrical body 28. The flange 30 may include one or more bolt holes 32 (FIG. 3) to facilitate attachment of the first end cap 14 to the housing 12 by bolts 34 or by other fasteners. The flange 30 may also include additional bolt holes to facilitate attachment of the first end 14 of the housing 12 to other external components, such as, for example, the gas box of an ion implantation system. One skilled in the art will appreciate that other attachment mechanisms, including adhesives or using a friction-tight fit, may be employed to attach the first end cap 14 to the housing 12. A second end of the first end cap 14 may include a cylindrical-shaped cavity 36 that is sized and shaped to receive the spring mechanism 24, described in detail below. A port 38, in the shape of a cylindrical passageway, extends longitudinally from the cavity 36 to the flange 30. The port 38 may be used to supply pressurized fluid, such as compressed air or nitrogen, to the shuttle 22 to advance the shuttle 22 within the housing 12. The first end cap 14 may also include fluid fittings, such as, for example, valves or piping connectors, to permit the port 38 to be connected to a source of pressurized fluid and to allow for the control of the flow of fluid to and from the first end cap 14. In the exemplary embodiment, the first end cap 14 engages the first end 16 of the housing 12 in a fluid-tight seal to inhibit leakage of pressurized gas during operation. One or more fluid seals, such as elastomeric O-rings or gaskets, may be provided to facilitate fluid sealing.

In the exemplary embodiment, the first end cap 14 is constructed of a conductive material, such as metal. The first end cap 14 is electrically connected to the shuttle 22 through the spring mechanism 24, as described in detail below. In this manner, the first end cap 14 operates as an electrical contact for the switch 10. The first end cap 14 may be externally connected to another device or a ground in a variety of manners. For example, an electrical wire may be secured between a bolt 34 and the flange 30 to provide an external electrical connection for the switch 10. Alternatively, a separate electrical connector may be provided to facilitate electrical connection to the switch 10. In embodiments of the first end cap 14 that are constructed of a non-conductive material, a separate electrical connector may be employed to provide an external electrical connection to the shuttle 22. In such embodiments, the electrical connector may operate as an electrical contact for the switch 10.

Continuing to refer to FIGS. 1 and 2, the spring mechanism 24 in the illustrated embodiment is a spring-biased reel 40 about which an electrically conductive wire is 42 wrapped. The wire 42 is connected to an end of the shuttle 22. The reel 40 is biased to maintain the wire 42 in a reeled state and, thus, the reel 40 maintains the shuttle 22 in proximity to the first end cap 14. In the present embodiment, for example, the shuttle 22 is biased into engagement to an end of the first end cap 14. A guide rod 44 may be positioned within the cavity 36 to inhibit fouling of the wire 42 during reel and unreeling.

One skilled in the art will appreciate that the spring mechanism 24 is not limited to the spring-biased reel described above. Other spring mechanisms may be employed to bias the shuttle 22. For example, a coiled spring may be optionally employed. Moreover, the spring mechanism 24 may be employed to bias the shuttle 22 into contact with the second end cap 18 or another component of the switch 12.

The shuttle 22 is generally cylindrical in shape and includes a centrally located bore 46 for receiving a T-shaped conductive member 48. The T-shaped conductive member 48 has a stem 52 that is sized and shaped to fit within the bore 46 and a base 54 that is oriented generally perpendicular to the stem 52. The conductive member 48 may be fixed within the bore 46 by an adhesive, by friction, or by another attachment mechanism. The wire 42 of the spring mechanism 24 is connected to the stem 52 of the shuttle 22. An annular magnetic washer 56 is interposed between the base 54 of the conductive member 48 and the shuttle 22. The magnetic washer 56 allows for position monitoring of the shuttle 22 by an externally mounted position sensor, described below.

The shuttle 22 may be constructed from a non-conductive material, a conductive material, or other material. In embodiments in which the shuttle 22 is constructed of a conductive material, e.g., metal, the conductive member 48 may be omitted. In the present exemplary embodiment, the shuttle 22 is constructed from a material having a low coefficient of friction, such as polytetrafluoroethylene (TEFLON®), to minimize friction on the shuttle 22 as the shuttle 22 is displaced within the housing 12. Optionally, the shuttle 22 may be coated with a material having a low coefficient of friction or a lubricant may be employed to facilitate displacement of the shuttle 22 within the housing 12.

The shuttle 22 may optionally include a plurality of longitudinally spaced apart annular grooves 58 that operate to inhibit fluid flow around the shuttle 22, between the shuttle 22 and the walls of the housing 12. The annular grooves 58 may operate in the manner of a labyrinth seal to reduce the flow of fluid around the shuttle 22 and thereby facilitate displacement of the shuttle 22 by pressurized fluid.

The second end cap 18 has a generally disc-shaped flange 60 and smaller diameter cylindrical section 61 that may be coaxial aligned with the flange 60, as illustrated in FIGS. 1, 2, and 4, or, in other embodiments, may be offset from the flange 60. The flange 60 of the second end cap 18 includes one or more bolt holes 62 for receiving one or more bolts 64 that are employed to attach the second end cap 18 to the housing 12. The flange 60 may also include additional bolt holes to facilitate attachment of the second end 20 of the housing 12 to other components. A bore 66 through the flange 60 and the cylindrical section 61 is sized and shaped to receive a bolt-shaped electrical contact 68. The electrical contact 68 may be constructed of a conductive material and includes a stem 70 and a perpendicular base 72. In the exemplary embodiment, the cylindrical section 61, and, optionally the flange 60, may be constructed from a non-conductive material, such as PVC. The cylindrical section 61 may be sized to receive an external electrical connector, such as an electrical wire or the like, within the bore 66. The external electrical connector may be connected to a ground or to another device.

A resilient member 76, such as an elastomeric gasket or a spring, is provided about the stem 70 of the electrical contact 68 and between the base 72 and the flange 60 of the second end cap 14. The resilient member 76 operates to cushion the impact of the shuttle 22 against the base 72 of electrical contact 68 as the shuttle 22 is advanced within the housing 12.

In the exemplary embodiment, the second end cap 18 engages the second end 20 of the housing 12 in a fluid-tight seal to inhibit leakage of pressurized gas during operation. One or more fluid seals, such as elastomeric O-rings or gaskets, may be provided to facilitate fluid sealing. In the present embodiment, for example, an elastomeric gasket 74 is interposed between the second end cap 18 and the housing 12.

In other exemplary embodiments, additional structures, other than the first end cap 14 and the second end cap 18, may be provided within the tubular housing 12 for the shuttle 22 to engage to establish a physical and/or electrical connection. For example, one or more stops may be provided within the housing 12 to define the displacement path of the shuttle 22. Likewise, one or electrical contacts may be provided within the housing 12 for the shuttle 22 to engage to establish an electrical connection.

Figure 5:
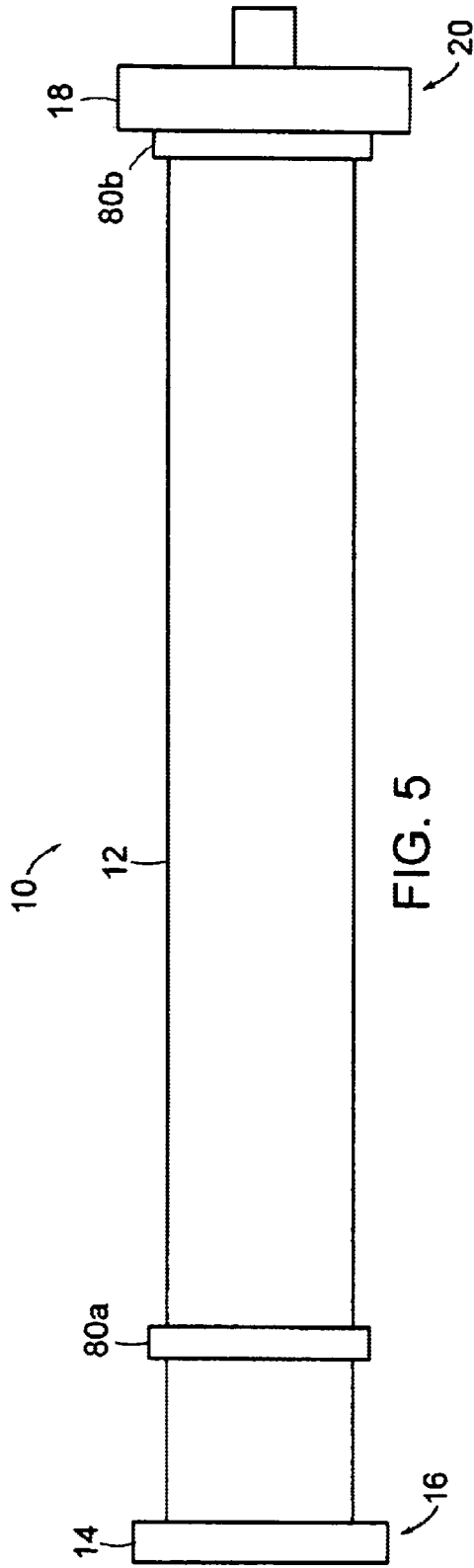
FIG. 5 is a side elevational view of the switch of FIG. 1.

As discussed above, the switch 10 may include one or more position sensors for monitoring the position of the shuttle 22 within the housing 12. In the exemplary embodiment, for example, a pair of magnetic proximity sensors 80a and 80b are positioned proximate the first end 16 and second end 20, respectively, of the housing, as best illustrated in FIG. 5. The magnetic sensors 80a, 80b operate to detect the magnetic washer 56 of the shuttle 22. Magnetic sensor 80a is aligned with the first position of the shuttle 22, e.g., when the shuttle 22 is engaged with the first end cap 14, as shown in FIG. 1. Magnetic sensor 80b is aligned with a second position of the shuttle 22, e.g., when the shuttle is engaged with the electrical contact 68 of the second end cap 18, as shown in FIG. 2. The sensors 80a, 80b may communicate position information to a central location or may display position information locally, such as through an audible alarm or with one or more indicator lights. One skilled in the art will appreciate that any number of sensors may be employed at any location along the housing 12 and that sensors other than magnetic sensors may be employed to monitor the position of the shuttle 22.

Operation of the exemplary embodiment of the switch 10 will be described in conjunction with FIGS. 1 and 2. Spring mechanism 24 biases the shuttle 22 into the first position proximate the first electrical contact, e.g., the first end cap 14 in the exemplary embodiment. In this configuration, the switch 10 is open as there is no electrical connection between the first electrical contact and the second electrical contact, e.g., electrical contact 68 in the present embodiment. To close the switch 10, pressurized fluid may be applied to the shuttle 22, through port 38, to advance the shuttle 22 toward the second electrical contact, electrical contact 68. The switch 10 is closed when the shuttle 22 is in the second position, e.g., the base 54 of the conductive member 48 is in electrical contact with the base 72 of the electrical contact 68, as illustrated in FIG. 2. When the switch 10 is closed, current may pass from the first electrical contact, the first end cap 14, through the wire 42 and the conductive member 48, to the second electrical contact, electrical contact 68 of the second end cap 18. A reduction of the pressurized fluid force to less than the biasing force provided by the spring mechanism 24 results in the shuttle 22 displacing within the housing in a direction toward the first end cap 14, causing the switch 10 to open.

Figure 6:
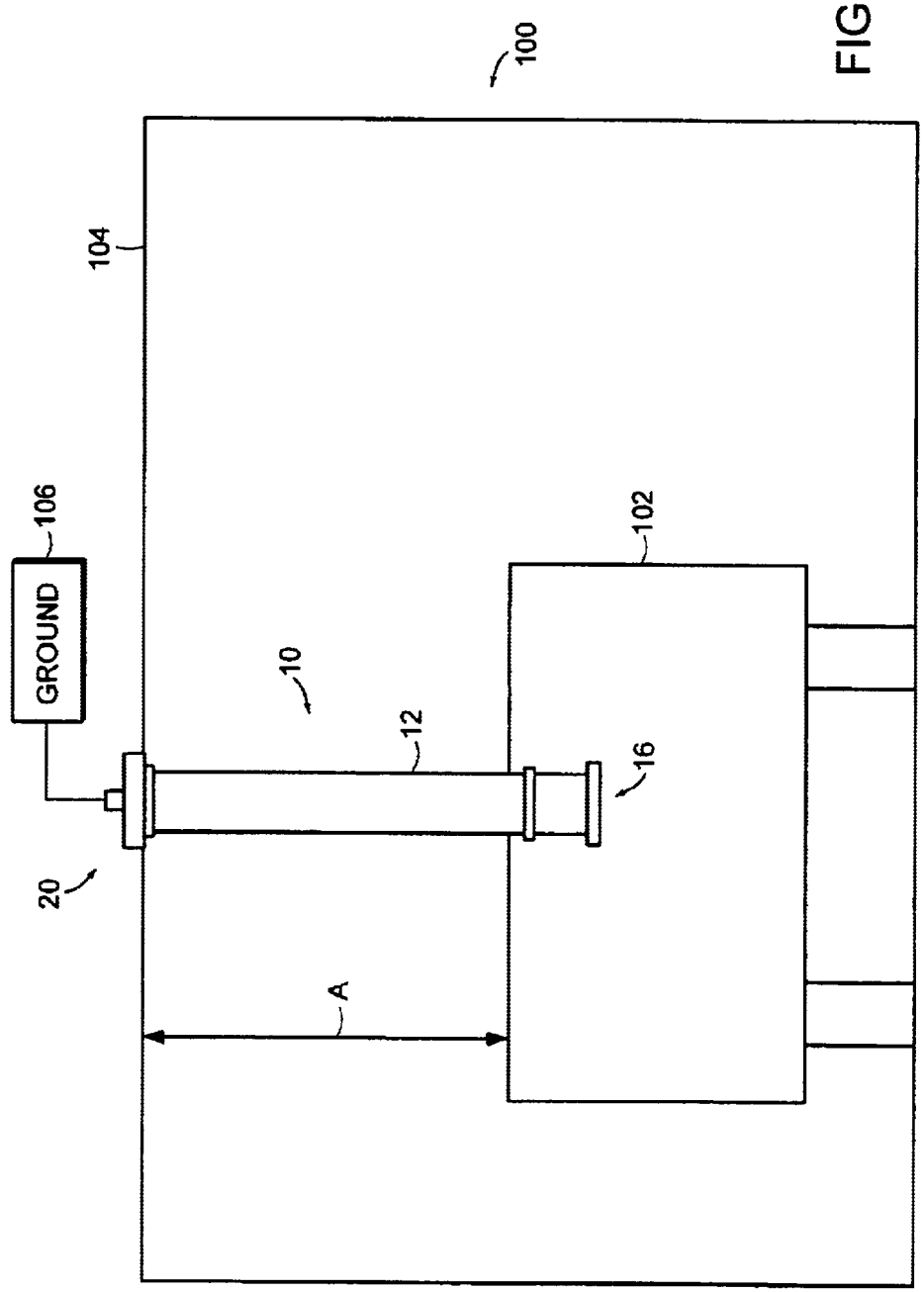
FIG. 6 is a schematic of a portion of an ion implantation system, illustrating the switch of FIG. 1 positioned between the gas box and a ground.

One skilled in the art will appreciate that the switch 10 may be employed in a variety of applications, including, for example, in high voltage environments to permit selective switching to a ground. In one application, for example, the switch 10 may be employed to selectively ground a gas box of an ion implantation system. A section 100 of an ion implantation system including the gas box 102 is illustrated schematically in FIG. 6. In certain modes of operation, the gas box is at a high voltage relative the frame 104 and other components of the ion implantation system. For example, in the acceleration mode the voltage differential between the gas box 102 and the frame 104 can be up to 27 keV. During the acceleration mode, the gas box 102 can be electrically isolated from the frame 104. In other modes of operation, such as the deceleration mode, the gas box 102 must be connected to a ground. Switch 10 is positioned in the air gap between the gas box 102 and the frame 104, as indicated by arrow A in FIG. 6, to allow the gas box 102 to be selectively electrically connected to a ground 106. In certain embodiments, the air gap A can be up to 3 feet in length. The first electrical contact of the switch 10 may be electrically connected to the gas box and the second electrical contact of the switch 10 may be connected to a ground 106. Although the ground 106 is illustrated as a separate component in the present embodiment, one skilled in the art will appreciate that the frame 104 may also operate as a ground and that other ground connections may be available based on the embodiment.

When the ion implantation system is operated in a high voltage mode, the switch 10 is open and the shuttle 22 is in the first position proximate the first end 16 of the housing 12. The switch 10 may be positioned in the gap A such that the shuttle 22 is within a portion of the housing 12 that is within the gas box 102 when the shuttle is in the first position. In this manner, no component of the switch 10 that is constructed of a conductive material is within the gap A. Only the housing 12, which is constructed substantially of a non-conductive material, is positioned within the gap A, thereby inhibiting arcing between the gas box 102 and the frame 104 in high voltage operation. When the switch is closed, the shuttle 22 is advanced to the second position, proximate the second end 20 of the housing 16, to establish an electrical connection between the gas box 102 and the ground 106.

While the switches and switching methods disclosed herein have been particularly shown and described with references to exemplary embodiments thereof, it will be understood by those skilled in the art that various changes in form and details may be made therein without departing from the spirit and scope of the disclosure. Those skilled in the art will recognize or be able to ascertain using no more than routine experimentation, many equivalents to the exemplary embodiments described specifically herein. Such equivalents are intended to be encompassed in the scope of the present disclosure.

I claim:

1. An electrical switch comprising:
   a housing having a non-conductive section constructed substantially of a non-conductive material,
   a first electrical contact positioned proximate one end of the housing,
   a second electrical contact spaced apart from the first electrical contact, at least portion of the non-conductive section being positioned between the first electrical contact and the second electrical contact, and
   a shuttle selectively displaceable within the housing between the first electrical contact and the second electrical contact, the shuttle being biased into a first position proximate the first electrical contact in a first mode of operation and, in a second mode of operation, being displaceable toward the second electrical contact to establish an electrical connection between the first electrical contact and the second electrical contact.

2. The electrical switch of claim 1, further comprising a first end cap positioned at a first end of the housing and a second end cap positioned at a second end of the housing.

3. The electrical switch of claim 2, wherein the first end cap engages the first end of the housing in a fluid tight seal and the second end cap engages the second end of the housing in a fluid tight seal.

4. The electrical switch of claim 2, wherein the first end cap includes the first electrical contact.

5. The electrical switch of claim 2, wherein the second end cap includes the second electrical contact.

6. The electrical switch of claim 2, wherein the first end cap includes an opening sized and shaped to connect with a source of pressurized gas.

7. The electrical switch of claim 1, further comprising a spring mechanism for biasing the shuttle into the first position.

8. The electrical switch of claim 7, wherein the spring mechanism is a spring-biased reel and the shuttle is connected to the reel by a wire wound about the reel.

9. The electrical switch of claim 1, wherein the shuttle is generally cylindrical in shape.

10. The electrical switch of claim 9, wherein an outer surface of the shuttle includes a plurality of spaced apart annular grooves.

11. The electrical switch of claim 9, wherein the shuttle has a longitudinal bore therethrough for receiving a bolt-shaped conductive member.

12. The electrical switch of claim 11, wherein the conductive member has a base that provides an electrical contact surface for the shuttle, the base engaging the second electrical contact when the shuttle is in the second position.

13. The electrical switch of claim 9, wherein the shuttle is constructed from a non-conductive material.

14. The electrical switch of claim 1, further comprising at least one position sensor for monitoring the position of the shuttle within the housing.

15. The electrical switch of claim 14, wherein the position sensor is a magnetic sensor and the shuttle includes a magnet for detection by the position sensor.

16. The electrical switch of claim 14, wherein the position sensor is positioned proximate the first electrical contact.

17. The electrical switch of claim 14, wherein the position sensor is positioned proximate the second electrical contact.

18. An electrical switch comprising:
   a tubular housing constructed substantially of a non-conductive material,
   a second electrical contact positioned at one end of the housing,
   a shuttle selectively displaceable within the housing between the first electrical contact and the second electrical contact, the shuttle being electically connected to the first electrical contact, and
   a spring mechanism positioned within the housing and connected to the shuttle to bias the shuttle into a first position proximate the first electrical contact, the shuttle being displaceable into engagement with the second electrical contact by pressurized gas to establish an electrical connection between the first electrical contact and the second electrical contact.

* * * * *